United States Patent [19]
Kanno et al.

[11] Patent Number: 5,468,918
[45] Date of Patent: Nov. 21, 1995

[54] CONDUCTIVE MEMBER FOR ELECTRIC CIRCUIT AND ELECTRIC CIRCUIT BODY, AND METHOD FOR FABRICATING THEM

[75] Inventors: Toshiaki Kanno; Makoto Katsumata; Hidenori Yamanashi; Hitoshi Ushijima, all of Shizuoka, Japan

[73] Assignee: Yazaki Corporation, Tokyo, Japan

[21] Appl. No.: 167,343

[22] Filed: Dec. 16, 1993

[30] Foreign Application Priority Data

Dec. 21, 1992 [JP] Japan ..................... 4-340374

[51] Int. Cl.⁶ .................................. H05K 1/00
[52] U.S. Cl. .................. 174/256; 174/257; 361/751
[58] Field of Search ........................... 174/250, 256, 174/257; 361/751; 428/901

[56] References Cited

U.S. PATENT DOCUMENTS

| | | | |
|---|---|---|---|
| 4,826,720 | 5/1989 | Wade | 428/209 |
| 4,915,981 | 4/1990 | Traskos et al. | 427/53.1 |
| 5,098,771 | 3/1992 | Friend . | |
| 5,151,221 | 9/1992 | Osterholm et al. . | |

FOREIGN PATENT DOCUMENTS

| | | |
|---|---|---|
| 0325236 | 7/1989 | European Pat. Off. . |
| 3014041A1 | 10/1981 | Germany . |
| 4133835A1 | 4/1992 | Germany . |
| 60-67675 | 4/1985 | Japan . |
| 61-47015 | 3/1986 | Japan . |
| 1-91363 | 4/1989 | Japan . |
| 476042 | 11/1937 | United Kingdom . |
| 1283916 | 8/1972 | United Kingdom . |
| 2000197 | 1/1979 | United Kingdom . |

*Primary Examiner*—Kristine L. Kincaid
*Assistant Examiner*—Cheryl R. Figlin
*Attorney, Agent, or Firm*—Nikaido, Marmelstein, Murray & Oram

[57] ABSTRACT

A conductor member for an electric circuit includes a conductive plastic mold in which carbon fibers or graphite fibers are dispersedly contained, and a metallic layer at least partially plated on the surface of said conductive plastic mold. The conductor member is provided on the surface of an insulating substrate to provide an electric circuit body. Thus, the conductor member for an electric circuit and the electric circuit body can be easily formed in a three-dimensional circuit because of its simple fabrication and excellent processing. Further, the film of metal plating can be made at a high speed and is hard to break because of the intimate contact of the plated metal.

10 Claims, 1 Drawing Sheet

CONDUCTIVE MEMBER FOR ELECTRIC CIRCUIT AND ELECTRIC CIRCUIT BODY, AND METHOD FOR FABRICATING THEM

BACKGROUND OF THE INVENTION

1. Field of the Invention

The present invention relates to a light-weight, excellent fabrication/processing property conductive member for an electric circuit, the electric circuit provided with such a conductor member and a method of fabricating them.

2. Description of the Prior Art

In recent years, electronic appliances have been used in all the industrial fields such as household electric appliances, motor vehicles, aerospace, etc. With development of demands for miniaturization, high density and personal use, the electric circuit used for an electronic appliance or an electronic unit in these fields has not been fabricated by the conventional electric wiring system, but by a printed circuit board (PC) or flexible printed board (FPC) system in which circuit patterns are made two-dimensionally using conductor such as metal on an insulating substrate.

These PCs are fabricated as follows. First, a composite plate composed of an insulating substrate and copper foil for conductor applied thereto, such as an epoxy resin composite member and phenol resin composite member, is prepared.

On such a plate, necessary circuit patterns are masked, and is subjected to etching to remove the copper foil portion other than the circuit pattern. Thus, the desired electric circuit is formed. The copper circuit portion is coated with corrosion resistance organic high-polymer, or plated with Ni, Sn, solder, Ag or Au. Incidentally, the FPC uses the insulating substrate of a plastic film having flexibility in place of the composite material of the epoxy resin or phenol resin in the PC. It is used at a bending portion or the portion where a circuit must be three-dimensionally formed.

Further, in recent years, several techniques have been proposed for directly making a circuit pattern on an insulating substrate without using a composite plate of the insulating material and a copper foil. They are a plastic plating method (JP-A (Laid-open)-1-91363), physical vapor deposition (PVD) and chemical vapor deposition (CVD) (JP-A-61-47015). But, these methods have the following defects. In the plastic plating method, electrolytic plating cannot be made for plastic which naturally has insulating property at a high film-forming speed and with a uniform film thickness and excellent intimate contact therewith. For this reason, generally, non-electrolytic plating is first made for a plastic face and thereafter the electrolytic plating is carried out. However, the ordinary non-electrolytic plating for plastic, in which the presence of catalyst is indispensable to the plastic surface, requires many complicate fabricating steps such as adsorption of the catalyst on the surface (activation processing) and making the plastic surface coarse for improving the intimate contact of the plating layer therewith (JP-A-60-67675).

The PVD and CVD methods require high cost because they are performed in a processing device with a sophisticated vacuum system. Further, since the film forming speed in these methods is lower than the above chemical plating method, they can be only applied to the circuit with a relative small current to which a large circuit resistance of the circuit body gives no trouble. Further, a technique has also been proposed in which a circuit is formed by printing, on an insulating material, a liquid or solution conductive plastic coating or paint composed of conductive material of metallic particles or flakes of e.g. Au, Ag, Cu and Ni and binder of plastic. When such a metallic conductive plastic material is used at an FPC bending portion, generally, the circuit resistance becomes unstable. Further, the paint including a conductive material of noble metal, although it is excellent in conductivity and corrosion resistance, is expensive.

SUMMARY OF THE INVENTION

An object of the present invention is to provide a conductor member for an electric circuit which can be easily formed in a three-dimensional circuit in addition to a two-dimensional planar circuit because of its simple fabrication and excellent processing.

Another object of the present invention is to provide a conductive member for an electric circuit on which the film of metal plating can be made at a high speed and is hard to break because of the intimate contact of the plated metal.

Still another object of the present invention is to provide an electric circuit body for an electric/electronic appliances including the above conductor members.

A further object of the present invention is to provide a method of fabricating the above conductive member and electric circuit body.

In accordance with one aspect of the present invention, there is provided a conductive member for an electric circuit in which at least one kind of metallic layer is at least partially provided on the surface of a conductive plastic mold dispersedly containing carbon fibers or graphite fibers, particularly those having a diameter of 5 µm or less and a length of 100 µm or less. The carbon fibers or graphite fibers used in the electric circuit conductive member according to the present invention can be obtained as follows. For example, a carbon series high polymer precursor is melt-spun, heat-treated for non-fusiblization in oxidizing atmosphere and heat-treated for carbonization at a temperature of 1000° C. in inert gas atmosphere to provide carbon fiber or graphite fiber having a diameter of 5 µm or less, preferably 0.5 µm or less. The fiber thus obtained is cut into short fibers having a length of 100 µm or less, preferably 50 µm or less by cutting and smashing. The carbon series high polymer precursor may be synthetic resin such as polyacrylonitrile, rayon, polyvinyl alcohol, vinyl chloride, phenol, polyamide, arramide (brand name), polyimide, or high polymer obtained from pitch of coal or oil.

Further, carbon fibers which can be grown from a vapor phase as follows can be also used. The material from a carbon supply source is changed into gas which is in turn brought into contact with ultra-fine metallic particles (which are made of transient metal such as Fe, Ni and Co and have a particle diameter of 300 Å or less) or a catalyst (which is made of e.g. liquid, solution or vaporizable metal (e.g. metalocene) organic compound) and decomposed together with a carrier gas such as hydrogen, carbon oxide, and carbon dioxide in a reaction region of 900°–1500° C. The vapor-phase growth carbon fiber having a length of 1000 µm or less and a diameter of 1 µm or less can be obtained. The above carbon supply source may be aliphatic hydrocarbon such as methane, ethane, propane and propylene; unsaturated aliphatic hydrocarbon such as ethylene, propylene, allene, acetylene; aromatic hydrocarbon such as benzene and toluene; alicyclic hydrocarbon such as cyclohexane and cyclooctane; organic acid such as ethanol, butanol, and octanol; ester such as butyl phthalate; ketone such as ethyl isobutyl and cyclohexane; nitrogen-containing organic compound such as haxylamine; sulphur-containing organic compound such as octyl-mercaptan; and chlorine-containing organic compound such as carbon tetrachloride.

The above vapor-phase carbon fiber can be heat-treated at a temperature of 1500°–3500° C. (preferably 2500° C. or more) for 3–120 minutes (preferably 30 minutes or more) in an atmosphere of inert or noble gas such as Ar. The graphite fiber having a highly developed graphite structure thus obtained can be also preferably used. It should be noted that these vapor-phase growth carbon fiber and graphite fiber are smashed into fibers having a short length of 100 µm or less as the need arises.

The high temperature heat treatment of these carbon fibers is preferable since it permits a later plating processing to be realized a high speed and permits the plating layer to be made uniform. It is preferred to use the graphite fiber in view of the permission current of the circuit formed for the reason why the graphite has excellent thermal conductivity.

The plastic used as a binder for dispersing the above carbon fiber or graphite fiber in the conductive member for an electric circuit according to the present invention may be thermoplastic resin such as polyethylene, polypropylene, polyvinyl chloride, ethylene vinyl-acetate copolymer, ethylene acryl-acid ester copolymer; thermosetting resin such as silicon resin, phenol resin, urea resin, epoxy resin and urethane resin; and rubber such as chlorosulfonic ethylene, chlorinated polyethylene, ethylene/propylene rubber, cloroprene rubber, acryl rubber, silicon rubber and fluororubber.

The method of dispersing carbon fibers or graphite fibers in such plastic should not be particularly limited. It can be carried out by a known kneading machine such as double-mixing roll, triple-mixing roll, intermix, Banbury mixer, single-axis kneader, and double-axis kneader.

In the electrically conductive plastic used in the electric circuit conductive material according to the present invention, the mixing ratio of the carbon fibers or graphite fibers to the plastic should not be particularly limited. It is preferable that the content of the fiber is 10–80 weight %. But, there are tendencies in a later electrolytic plating step that a higher electrically-conductive material permits a film to be formed at a higher speed and in a more uniform film thickness, and the more coarse surface state due to mixing of the fibers provides more excellent contact of the plating layer. Thus, more doping amount of the carbon or graphite fibers provides a more excellent plating layer whereas excess amount of the fibers provides more poor molding property of the carbon member. As a result, the content of fibers of 30–60 weight is preferable.

In accordance with the kind of used resin and the using environment, such electrically conductive plastic may contain an additive, component or solvent such as a filler, processing aid, plasticizer, antioxidant and crosslinking agent.

In accordance with the present invention, a conductive member for an electric circuit can be formed from an electrically conductive plastic by any molding method such as extrusion molding, injection molding, transfer molding, press molding. The kind of molding method to be used can be optionally selected in accordance with the property of plastic and the shape of the mold. Further, a metallic plate or line and metallic mesh as a reinforcement material or electrically conductive auxiliary member may be inserted into the terminal connection portion or stress concentration portion in the molded conductive member.

The conductive member has a surface at least partially plated with at least one kind of metal. The plating can be carried out by any of ordinary methods alone or in combination. The methods include electrolytic plating by electrolysis of a metal salt solution, non-electrolytic plating using reduction force of the reduction agent contained in a metal salt solution, PVD method such as vacuum metallizing by metal or compound vaporized or ionized in vacuum, sputtering and ion plating, and CVD method in which vapor of the compound (mainly metal halide) of a material used for plating supplied together with a carrier gas is thermally decomposed in the surface of an object so that it is plated on the object surface or the metal is deposited by hydrogen reduction. Such a plating processing can be optionally carried out in accordance with the fabrication condition of a conductive member, e.g. after the molding or after the mold is carried on an insulating substrate.

The electric circuit conductive member molded into a circuit shape and subjected to the plating processing in accordance with the above procedure is optionally carried on the surface of an insulating substrate by means of mechanical fixing, pressing, connecting or fusing, thus providing an electric circuit body. Otherwise, in molding the electrically conductive plastic in a circuit shape, with the insulating substrate previously attached in a mold, the conductive member may be molded integrally with the insulating substrate, and may be thereafter subjected to the metal plating to provide an electric circuit body. Further, when the electrically conductive plastic is a liquid or solution conductive paint or coating composed of carbon fibers or graphite fibers and liquid synthetic resin (or the synthetic resin solved in solvent), the liquid or solution may be printed on the surface of the insulating substrate to form an electric circuit pattern, and subjected to curing or hardening processing by e.g. leaving at room temperature, heating, and solvent removal by pressure reduction. Thereafter, the electric circuit pattern may be plating-processed integrally to the insulating substrate to provide an electric circuit body.

In accordance with the present invention, an electric circuit body having an optional shape can be easily formed using electrically conductive plastic, and the circuit body has good metal plating contact because of the anchor effect of a minute carbon fiber filler.

The above and other objects and features of the present invention will be more apparent from the following description taken in conjunction with the accompanying drawings.

DESCRIPTION OF THE PREFERRED EMBODIMENTS

Reference Example 1

Polyacrylonitrile was heated to be melt-spun. It was oxidized in an air atmosphere at 250° C. while stretching force is applied thereto, and heat-treated in an inert gas atmosphere at 3000° C. The fiber thus obtained was cut into fibers having a length of 1–0.5 mm which were in turn smashed using a ball mill. Thus, carbon fibers A having an average length of 10 µm and a diameter of 4 µm were obtained.

Reference Example 2

Oil-series meso-phase pitch having a softening point of 280° C. and an optical anisotropy of 100% was heated to be melt-spun. It was oxidized in an air atmosphere at 330° C. while stretching force is applied thereto, and heat-treated in an inert gas atmosphere at 3000° C. The fiber thus obtained was cut into fibers having a length of 1–0.5 mm which were in turn smashed using a ball mill. Thus, carbon fibers B having an average length of 30 µm and a diameter of 4 µm were obtained.

Reference Example 3

Using benzene as a carbon supply source for carbon fibers, ferrocene as a catalyst, the carbon fiber having a length of 50 µ and a diameter of 0.01–0.5 µm was grown from a vapor phase at 1100° C. in the atmosphere of carrier gas of hydrogen. The carbon fibers thus obtained were heat-treated at 3000° C. in an atmosphere of Ar gas to provide graphitized vapor-phase growth fibers C.

Embodiment 1

The carbon fibers A obtained in Reference Example 1 were added to polypropylene resin (Nihon Petroleum Chemical Co. Ltd, J650G) by a two-axis kneading machine so that it is contained by 40 weight %. Thus, an electrical conductive plastic for injection molding having an electric resistance of $1\times10$ Ω cm was prepared. The conductive plastic was injection-molded to form a strip-shape sample piece having a dimension of a length of 100 mm×a width of 25 mm×a thickness of 1 mm. The sample piece was dipped in a Cu plating electrolyte ($CuSO_4$ $5H_2O$:200 g/liter, $H_2SO_4$:500 g/liter) and electrically-plated with a current density of 0.02-3A/dm$^2$. An electrically circuit conductive member I with its surface plated with Cu was obtained. The peeling strength (Kgf/cm) of the plating layer obtained was measured by the method defined by JIS-C-6481. Table 1 shows the evaluation result.

Embodiment 2

In the same manner as in Embodiment 1 except that the carbon fibers B obtained in Reference Example 2, in place of the carbon fibers A, were added to be contained by 40 weight %, an electrically conductive plastic having an electric resistance of $5\times10^0$ Ωcm was prepared. Using this conductive plastic, an electric circuit conductive member II with its surface plated with Cu was formed. The separating strength of the plating layer was measured in the same way as in Embodiment 1. Table 1 also shows the evaluation result.

Embodiment 3

Figure 1:
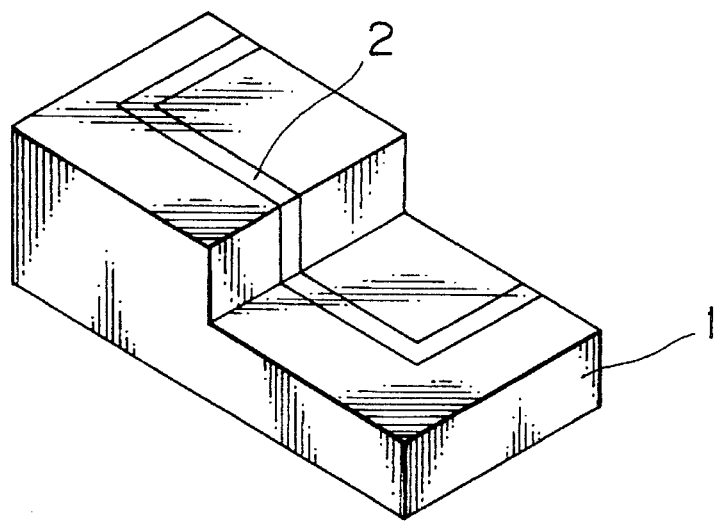
FIG. 1 is a perspective view of an example of the electric circuit body according to the present invention.

In the same manner as in Embodiment 1 except that the carbon fibers C obtained in Reference Example 3, in place of the carbon fibers A, were added to be contained by 40 weight %, an electrically conductive plastic having an electric resistance of $4\times10^0$ Ωcm was prepared. Using the plastic thus prepared and the polypropylene resin used in Embodiment 1, insertion molding was carried out to fabricate a mold as shown in FIG. 1 in which an electrically conductive circuit (width of 10 mm) 2 is formed on a polypropylene mold (insulating substrate) 1. The mold thus fabricated was subjected to electric plating as in Embodiment 1. Thus, an electric circuit body III was obtained in which the insulating substrate with its exposed surface of the conductive plastic plated with Cu and the conductor are integrally molded in a three-dimensional structure. The separating strength of the plating layer was measured in the same way as in Embodiment 1. Table 1 also shows the evaluation result.

Embodiment 4

Figure 2:
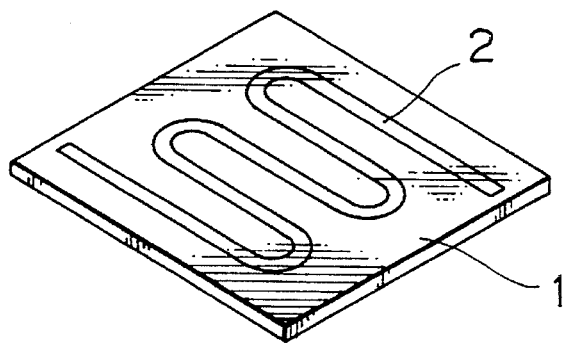
FIG. 2 is a perspective view of an example of the electric circuit body according to the present invention.

A curing agent (YUKA SHELL EPOXY Co. Ltd., DICY-7) of 5 weight portion, and the carbon fiber C of 20 weight portion are added to epoxy resin (YUKA SHELL EPOXY Co. Ltd, epi-coat 828) of 100 weight portion using a triple-mixing roll kneading machine, thus preparing electrically conductive paste. By the screen printing (120 mesh), the paste was printed on a glass phenol resin to form an electric circuit having a pattern as shown in FIG. 2. The printed circuit was cured by the heat-treatment for one hour at 160° C. The substrate was plated with Cu as in Embodiment 1 to provide a PC electric circuit body IV.

The separating strength of the plating layer was measured in the same way as in Embodiment 1. Table 1 also shows this evaluation result.

Embodiment 5

In the same manner as in Embodiment 4 expect that a circuit was printed, by the screen printing, on a polyimide film (75 µm thick) substrate instead of the glass phenol substrate, an FPC electric circuit body V was obtained.

Figure 3:
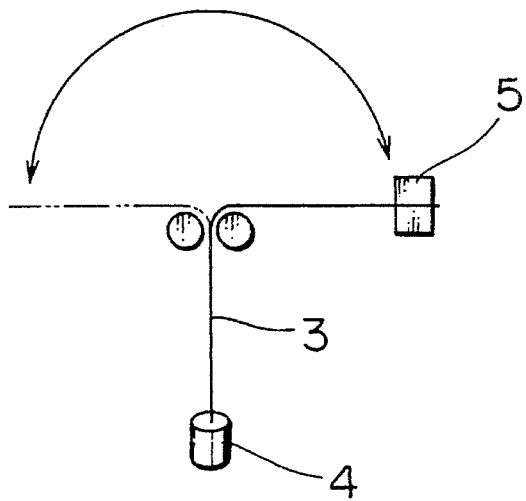
FIG. 3 is a conceptual view for explaining a method of testing the flex resistance of an FPC electric circuit body.

The flex breaking test of the FPC thus obtained was performed in accordance with the method as shown in FIG. 3, specifically in such a manner that with an FPC circuit sample 5 on which a pulling weight 4 (100 g) is hung, a rotary clamp 5 is rotated repeatedly by 180°. The number of times of flex until the circuit is opened or cut was measured to evaluate the flex resistance of FPC. Table 2 shows the number of times of flex until the circuit is opened.

Comparison Example 1

In the same manner as in Embodiment 1 except that the carbon fiber commercially available (Toray Industries, Inc. TOREKA T300MLD30, thickness of 30 µm, diameter of 7 µm) in place of the carbon fiber A, was added to be contained by 40 weight %, an electrically conductive plastic was prepared. Although the circuit body molded in the same manner as in Embodiment 1 was plated with Cu, the resultant plating layer was not uniform and its contact was poor. As a result, an excellent circuit conductive member for an electric circuit could not be obtained.

Comparison Example 2

In the same manner as in Embodiment 1 except that the carbon fiber commercially available (Nihon Kanka Co. Ltd., SPG40, average gain diameter of 4 µm) in place of the carbon fiber A, was added to be contained by 40 weight %, an electrically conductive plastic was prepared. The circuit mold having a three-dimensional structure was made in the same manner as in Embodiment 3. The mold was plated with Cu to provide an electric circuit C-1. The peeling strength of the resultant plating layer was measured in the same way as in Embodiment 1. Table 1 shows its evaluation result.

Comparison Example 3

Using a silver-series electrically conductive paste (Fujikura Kasei Co. Ltd.) as a conductive paste, a circuit was printed on a polyimide film by screen printing (250 mesh) so as to form a printing circuit as in Embodiment 5. The circuit body was cured by the heat-treatment at 150° C. for 0.5 hour, thereby providing a FPC electric circuit body C-II.

The same flex breaking test for the EPC as in Embodiment 5 was carried out. Table 2 also shows the evaluation result.

Comparison Example 4

The EPC electrical circuit body C-II obtained by Comparison Example 3 was plated with Cu. The resultant plating layer was formed uniformly but its contact was poor. As a result, a desired electric circuit body could not be obtained.

TABLE 1

| Electric Circuit Body or Conductive Member for Electric Circuit | Peeling Strength (kgf/cm) |
| --- | --- |
| I (fiber A) | 0.54 |
| II (fiber B) | 0.66 |
| III (fiber C) | 0.75 |
| IV | 0.87 |
| C-1 | 0.13 |

I–IV: Embodiments
C - 1: Comparison Example

TABLE 2

| Electric Circuit Body | Flex-Resistance (number of times) |
| --- | --- |
| V | 10,000 times or more |
| C - II | 345 times |

V: Embodiment
C - II: Comparison Example

In accordance with the present invention, an electric circuit body having any shape with excellent plating contact and flex resistance can be easily fabricated by a known molding method.

We claim:

1. A conductor member for an electric circuit comprising:

a conductive plastic mold in which carbon fibers or graphite fibers are dispersedly contained, wherein said carbon or graphite fibers have a diameter of 5 μm or less and a length of 100 μm or less; and a metallic layer at least partially provided on the surface of said conductive plastic mold.

2. An electric circuit body comprising the conductor member according to claim 1 which is provided on an electric insulating substrate.

3. A conductive member according to claim 1, wherein said carbon or graphite fibers are contained by 10–80 weight % in said plastic mold.

4. An electric circuit body comprising a conductor member, wherein said conductor member is provided on an electrically insulating substrate, and comprises a conductive plastic mold in which carbon fibers or graphite fibers are dispersedly contained, wherein said carbon or graphite fibers have a diameter of 5 μm or less and a length of 100 μm or less, and a metallic layer at least partially provided on the surface of said conductive plastic mold.

5. A method of fabricating the conductor member as claimed in claim 4, comprising the steps of:

injection-molding a thermoplastic plastic in which said carbon fibers or graphite fibers are dispersedly contained, thereby providing said mold of conductive plastic, and plating a portion of the surface of the mold with metal.

6. A method of fabricating the conductor member as claimed in claim 4, comprising the steps of:

integrally molding a conductive plastic in which said carbon fibers or graphite fibers are dispersedly contained onto an insulting substrate, thereby providing a laminate mold of the conductive plastic and substrate; and plating a portion of the surface of the plastic of said mold with metal.

7. A method of fabricating the conductor member according to claim 5, wherein said carbon or graphite fibers are contained by 10–80 weight % in said plastic.

8. A method of fabricating the conductor member according to claim 6, wherein said carbon or graphite fibers are contained by 10–80 weight % in said plastic.

9. A method of fabricating the conductor member as claimed in claim 4, comprising the steps of:

printing, on said electrically insulating substrate, liquid or solvent type paste in which said carbon fibers or graphite fibers are dispersedly contained, thereby making an electric circuit pattern; performing curing, removal of solvent or both for said substrate; and plating a portion of the surface of said pattern with metal.

10. A method of fabricating the conductor member according to claim 9, wherein said carbon or graphite fibers are contained by 10–80 weight % in said plastic mold.

* * * * *